(12) United States Patent
Lee

(10) Patent No.: US 12,720,850 B2
(45) Date of Patent: Aug. 25, 2026

(54) HIGH VOLTAGE SEMICONDUCTOR DEVICE HAVING SCHOTTKY BARRIER DIODE

(71) Applicant: SK keyfoundry Inc., Cheongju-si (KR)

(72) Inventor: Tae Hoon Lee, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 530 days.

(21) Appl. No.: 18/302,358

(22) Filed: Apr. 18, 2023

(65) Prior Publication Data

US 2024/0105838 A1 Mar. 28, 2024

(30) Foreign Application Priority Data

Sep. 23, 2022 (KR) ........................ 10-2022-0120559

(51) Int. Cl.
*H10D 84/00* (2025.01)
*H10D 30/65* (2025.01)
*H10D 62/10* (2025.01)
*H10D 62/17* (2025.01)

(52) U.S. Cl.
CPC ......... *H10D 84/156* (2025.01); *H10D 30/655* (2025.01); *H10D 62/107* (2025.01); *H10D 62/371* (2025.01)

(58) Field of Classification Search
CPC .. H10D 84/156; H10D 30/655; H10D 62/107; H10D 62/371; H10D 62/127; H10D 62/115; H10D 64/64; H10D 84/811; H10D 30/0281–0289; H10D 30/65–659; H10D 8/60–605
See application file for complete search history.

(56) References Cited

U.S. PATENT DOCUMENTS 7,906,386 B2 3/2011 Pang
9,196,723 B1 * 11/2015 Chen ...................... H10D 30/65
2022/0157982 A1 5/2022 Chiu et al.

FOREIGN PATENT DOCUMENTS

CN 115020497 A * 9/2022 ......... H10D 30/0281
KR 10-2006-0097808 A 9/2006
KR 10-0853802 B1 8/2008
(Continued)

OTHER PUBLICATIONS

Korean Office Action Issued on Nov. 7, 2025, in Counterpart Korean Patent Application No. 10-2022-0120559 (8 Pages in English, 8 Pages in Korean).

*Primary Examiner* — Shahed Ahmed
(74) *Attorney, Agent, or Firm* — NSIP Law

(57) ABSTRACT

A semiconductor device includes a device region, including a source contact, a drain contact formed on a substrate, and a gate contact formed between the source contact and the drain contact; an isolation region surrounding the device region, the isolation region including an N-type semiconductor region formed on the substrate, a first silicide layer and a second silicide layer formed in the N-type semiconductor region and separated from each other by an isolation layer, and an anode contact and a cathode contact connected to the first silicide layer and the second silicide layer, respectively; and a Schottky barrier diode formed inside the isolation region by a junction of the first silicide layer and the N-type semiconductor region. The anode contact is connected to the source contact, and the cathode contact is connected to the drain contact.

15 Claims, 8 Drawing Sheets

(56) References Cited

FOREIGN PATENT DOCUMENTS

| | | | |
|---|---|---|---|
| KR | 10-2013-0004707 | A | 1/2013 |
| KR | 10-2020-0095640 | A | 8/2020 |
| KR | 10-2020-0134824 | A | 12/2020 |

* cited by examiner

Isolation region (202)

Device region (201)

Isolation region (202)

P+ region

N+ region

Isolation region (202)

Device region (201)

Isolation region (202)

P+ region

N+ region

500
Isolation region (202)
Device region (201)
Isolation region (202)
B
C
A
D
G
S
G
D
A
C
B
273
240
250
242
271
270
210
261
262
260
238
233
237
236
234
235
P+ region
N+ region 600
Isolation region
(202)
Device region(nLDMOS array)
(201)
Isolation region
(202)
B
C
A
S
G
D
D
G
S
A
C
B
240
242
260
262
261
235
236
238
233
234
232
231
220
210
260
262
261
270
P+ region
N+ region

HIGH VOLTAGE SEMICONDUCTOR DEVICE HAVING SCHOTTKY BARRIER DIODE

CROSS-REFERENCE TO RELATED APPLICATION

This application claims the benefit under 35 USC 119 to Korean Patent Application No. 10-2022-0120559, filed on Sep. 23, 2022, in the Korean Intellectual Property Office, the entire disclosure of which is incorporated herein by reference for all purposes.

BACKGROUND

1. Field

This disclosure relates to a high-voltage semiconductor device having a Schottky barrier diode.

2. Description of Related Art

A Bipolar-CMOS-DMOS (BCD) device or a high voltage device includes a Schottky Barrier Diode (SBD) or a Schottky Diode (SD) to possess the properties of high-speed switching operation.

A Schottky barrier diode is a type of diode that combines an N-type semiconductor and a metal, and has superior high-speed switching operation characteristics compared to a general PN junction diode. The Schottky barrier diode has a lower turn-on voltage than a PN junction diode. Due to the lower turn-on voltage, the Schottky barrier diode may switch faster than the PN junction diode.

On the other hand, a BCD device or a high-voltage device may require a wide isolation region for electrical isolation from an adjacent device. In addition, as the Schottky barrier diode is separately added for a fast switching operation, there is a problem in that a chip area of the BCD device or the high voltage device may be further increased.

The above information is presented as background information only to assist with an understanding of the present disclosure. No determination has been made, and no assertion is made, as to whether any of the above might be applicable as prior art with regard to the disclosure.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In one general aspect, a semiconductor device includes a device region, including a source contact, a drain contact formed on a substrate, and a gate contact formed between the source contact and the drain contact; an isolation region surrounding the device region, the isolation region including an N-type semiconductor region formed on the substrate, a first silicide layer and a second silicide layer formed in the N-type semiconductor region and separated from each other by an isolation layer, and an anode contact and a cathode contact connected to the first silicide layer and the second silicide layer, respectively; and a Schottky barrier diode formed inside the isolation region by a junction of the first silicide layer and the N-type semiconductor region. The anode contact is connected to the source contact, and the cathode contact is connected to the drain contact.

The device region may further include a source region formed in a P-type body region, and a drain region formed in an N-type drift region.

The semiconductor device may further include a P-type guard ring region surrounding the isolation region.

The isolation region may further include a first P-type well region and a second P-type well region formed in contact with the first silicide layer, and an N-type well region formed in contact with the second silicide layer.

The P-type body region of the device region may overlap the N-type semiconductor region of the isolation region.

The N-type drift region of the device region may overlap the N-type semiconductor region of the isolation region.

The device region may further include an N-type buried layer formed on the substrate, a P-type semiconductor region formed on the N-type buried layer, and a P-type buried layer formed in the P-type semiconductor region. The N-type buried layer may contact the N-type semiconductor region of the isolation region.

A length of the N-type buried layer may be greater than a length of the P-type buried layer.

In another general aspect, a semiconductor device includes a source region and a drain region formed in a substrate; a gate electrode formed between the source region and the drain region; an N-type semiconductor region formed to surround the source region, the drain region, and the gate electrode; a first silicide layer and a second silicide layer formed on the N-type semiconductor region and formed placing an isolation layer therebetween; and a Schottky barrier diode formed by a conjunction of the first silicide layer and the N-type semiconductor region. The source region is connected to the first silicide layer, and the drain region is connected to the second silicide layer.

The semiconductor device may further include a source contact formed on the source region, a drain contact formed on the drain region, an anode contact formed on the first silicide layer, and a cathode contact formed on the second silicide layer. The source contact and the anode contact may be connected to each other via a first metal wiring, and the drain contact and the cathode contact may be connected to each other via a second metal wiring.

The semiconductor device may further include an N-type buried layer formed on the substrate; a P-type semiconductor region formed on the N-type buried layer; and a P-type buried layer, an N-type drift region, and a P-type body region formed in the P-type semiconductor region. The N-type buried layer may be formed in contact with the N-type semiconductor region, and a length of the N-type buried layer may be greater than a length of the P-type buried layer.

The semiconductor device may further include a P-type guard ring region formed to surround the N-type semiconductor region.

In another general aspect, a semiconductor device includes an N-type semiconductor region formed to surround a source region, a drain region, and a gate electrode between the source region and the drain region; silicide layers formed on the N-type semiconductor region and spaced apart from each other by an isolation layer; and a Schottky barrier diode formed at an interface of one of the silicide layers and the N-type semiconductor region. The source region is connected to the one of the silicide layers, and the drain region is connected to another of the silicide layers.

The semiconductor device may further include an isolation region, including the N-type semiconductor region, the silicide layers, an anode contact connected to the one of the silicide layers, and a cathode contact connected to the other of the silicide layers.

The semiconductor device may further include a device region, including the source region and the drain region formed in an N-type drift region.

The isolation region may surround the device region.

The source region may be formed in a P-type body region, and the drain region may be formed in an N-type drift region.

Other features and aspects will be apparent from the following detailed description, the drawings, and the claims.

BRIEF DESCRIPTION OF THE DRAWINGS

FIG. 3 illustrates a sectional view of another example high voltage semiconductor device having a Schottky barrier diode in accordance with one or more embodiments.

FIG. 4 illustrates a sectional view of an example high-voltage semiconductor device having a Schottky barrier diode in accordance with one or more embodiments.

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
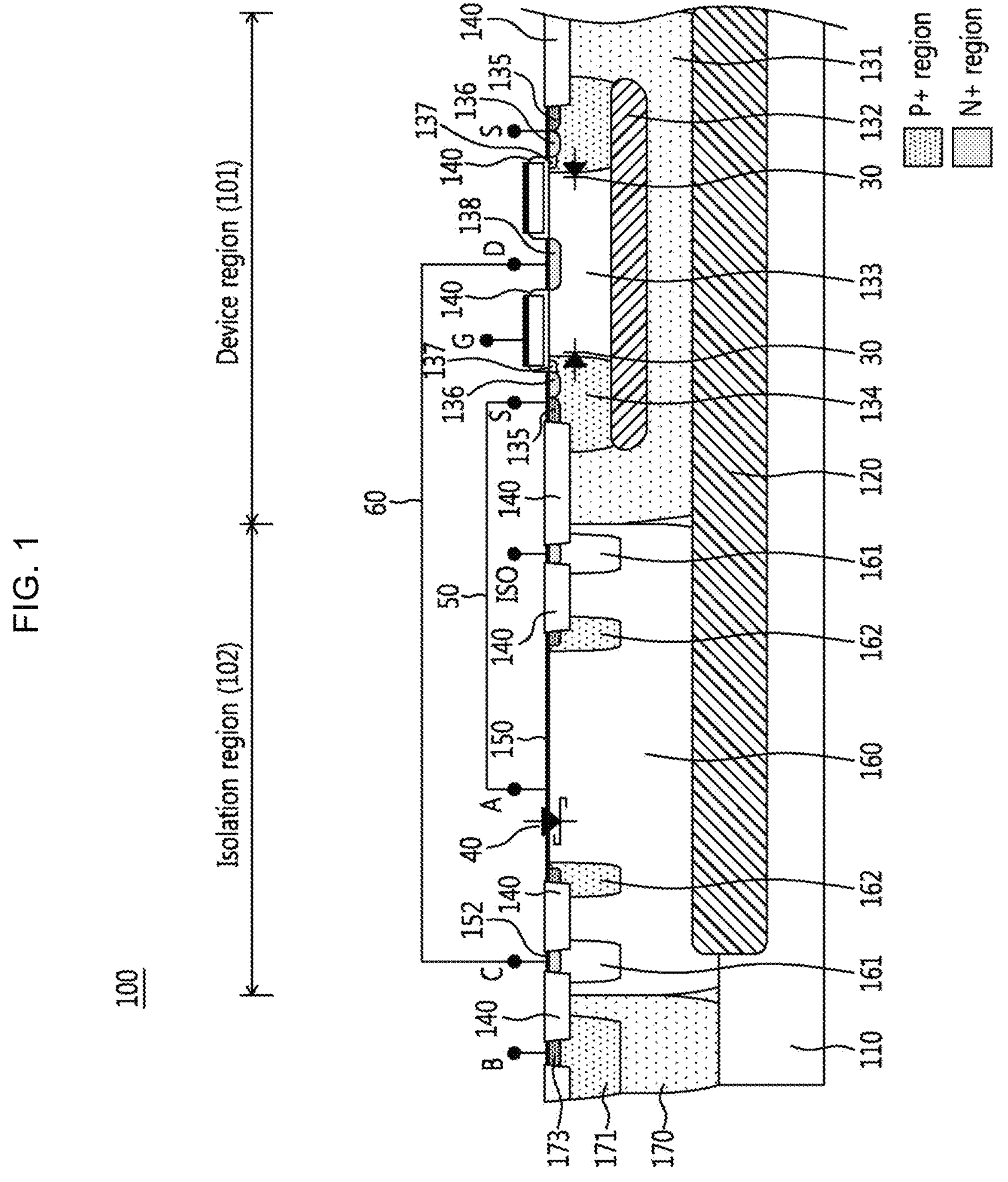
FIG. 1 illustrates a view of an example high-voltage semiconductor device having a Schottky barrier diode in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, one or more embodiments are described taking examples in which a Schottky barrier diode is used as a switching diode for supporting relatively fast switching operations.

A high-voltage semiconductor device is provided. A high voltage semiconductor device in which a Schottky barrier diode is inserted in an isolation region desired for electrical separation of a BCD device or a high voltage device and an adjacent device is provided.

FIG. 1 illustrates a view of an example high-voltage semiconductor device having a Schottky barrier diode in accordance with one or more embodiments.

Referring to FIG. 1, a high voltage semiconductor device 100 supporting relatively fast switching operations, in accordance with one or more embodiments, may include a device region 101 and an isolation region 102. Therein, the isolation region 102 may surround the device region 101 for electrical separation from an adjacent device. A body diode 30 (or a PN junction diode) may be formed in the device region 101, and a Schottky barrier diode (SBD) 40 (also called a Schottky Diode (SD)) may be formed in the isolation region 102. In such a manner, the body diode 30 and the Schottky barrier diode 40 may be formed in one chip (i.e., the high-voltage semiconductor device 100).

In FIG. 1, a high voltage device (e.g., an n-channel Laterally Diffused Metal Oxide Semiconductor (nLDMOS) device) may be formed in the device region 101 in accordance with one or more embodiments. In a non-limiting example, the nLDMOS device may switch power supply circuits, such as AC-DC converters, DC-DC converters, or high-voltage circuits. The device region 101 may include an N-type buried layer 120 formed on a substrate 110, a P-type semiconductor region 131 formed on the N-type buried layer 120, a P-type buried layer 132 formed in the P-type semiconductor region 131, an N-type drift region 133 and a P-type body region 134 formed on the P-type buried layer 132, a source contact S formed on the P-type body region 134, a drain contact D formed on the N-type drift region 133, and a gate contact G formed between the source contact S and the drain contact D. A P-type pick-up region 135, an N-type source region 136, and an N-type LDD region 137 may be formed in the P-type body region 134. An N-type drain region 138 may be formed in the N-type drift region 133. The regions formed in the device region 101 will be described in further detail when describing FIG. 3.

The body diode 30 is formed in the device region 101, and the body diode 30 may be formed by a PN junction. For example, a PN junction may be formed between the P-type body region 134 and the N-type drift region 133. The body diode 30 that operates in the forward direction is formed by the PN junction. Such body diode 30 is a switching diode. When the switch is changed from ON-state to OFF-state, carriers may escape through the body diode 30. However, the body diode 30 has a disadvantage in terms of its long reverse recovery time $T_{rr}$ due to its high turn-on voltage, and a switching loss largely due to the long reverse recovery time $T_{rr}$. Herein, the reverse recovery time $T_{rr}$ refers to a time duration taken to switch the switching diode from ON-state to complete OFF-state (see FIG. 8).

The isolation region 102 may include an isolation layer 140, an N-type semiconductor region 160, an anode contact A, and a cathode contact C. Therein, the cathode contact C may be used as an isolation node (ISO) in the isolation region 102. The same voltage may be applied, bonding the cathode contact C and the isolation node ISO as one. Different currents may be applied to each cathode contact C and the isolation node if desired. The Schottky barrier diode 40 may be formed between the anode contact A and the N-type semiconductor region 160. The anode contact A may be formed in contact with a Schottky barrier metal. Silicide materials may be used as the Schottky barrier metal. The anode contact A and the cathode contact C may be formed using materials such as Tungsten (W), Copper (Cu), etc.

A first silicide layer 150 and a second silicide layer 152 are Schottky barrier metals, and each may be formed on a surface of the N-type semiconductor region 160. The first silicide layer 150 and the second silicide layer 152 may be physically/electrically connected to the anode contact A and cathode contact C, respectively. The first and second silicide layers 150, 152 may be formed using nickel silicide, cobalt silicide, or titanium silicide.

The first silicide layer 150 may be an anode, and the N-type semiconductor region 160 may be a cathode. Hence, the Schottky barrier diode 40 may be formed between the first silicide layer 150 and the N-type semiconductor region 160.

An N-type well region 161 may be formed inside the N-type semiconductor region 160 to lower the resistance of the N-type semiconductor region 160. The cathode contact C may be formed on the N-type well region 161.

An STI or LOCOS process may be applied to form the isolation layer 140. The isolation layer 140 may contact one or more of the P-type semiconductor region 131, P-type body region 134, N-type drift region 133, P-type pick-up region 135, or N-type LDD region 137.

At least one P-type well region 162 may be formed in the N-type semiconductor region 160. The P-type well region 162 may be formed in contact with the first silicide layer 150. The P-type well region 162 may help improve the breakdown voltage of the Schottky barrier diode 40.

A P-type guard ring region 170 may be formed surrounding the N-type semiconductor region 160 to provide the ground voltage to the substrate 110. The P-type guard ring region 170 may include a P-type well region 171 and a highly-doped P-type region (P+) 173. A body contact B may be formed on the highly-doped P-type region 173. The body contact B may be formed of tungsten or copper.

As illustrated in FIG. 1, the anode contact A of the isolation region 102 may be electrically connected to the source contact S of the device region 101 through the first metal wiring 50. The cathode contact C of the isolation region 102 may be electrically connected to the drain contact D of the device region 101 through a second metal wiring 60.

When the example semiconductor device 100 is turned from a switch On-state to a switch OFF-state, carriers remaining in the P-type body region 134 may escape through two routes.

The first route is to go through the body diode 30 formed by the PN junction of the device region 101. The carriers remaining in the P-type body region 134 of the device region 101 go through the N-type drift 133 such that the electrons may escape to the drain contact D.

The second route is to go through the Schottky barrier diode 40 of the isolation region 102. The carriers remaining in the P-type body region 134 of the device region 101 may escape to the drain contact D of the device region 101 after going through the source contact S, the first metal wiring 50, the anode contact A in the isolation region 102, N-type semiconductor region 160, the N-type well region 161 and cathode contact C, and the second metal wiring 60.

Therein, the Schottky barrier diode 40 has a lower turn-on voltage than the body diode 30. Hence, more electrons may escape through the Schottky barrier diode 40. In other words, a reverse recovery time ($T_{rr}$) of the Schottky barrier diode 40 is short, and helpful to enable relatively fast switching off. That makes the semiconductor device 100, including Schottky barrier diode 40, perform a relatively fast switching operation and a relatively small switching loss.

In addition, the example semiconductor device 100 may reduce the size of a semiconductor chip by adding the Schottky barrier diode 40 to the isolation region 102 and also may reduce the reverse recovery time ($T_{rr}$).

Figure 2:
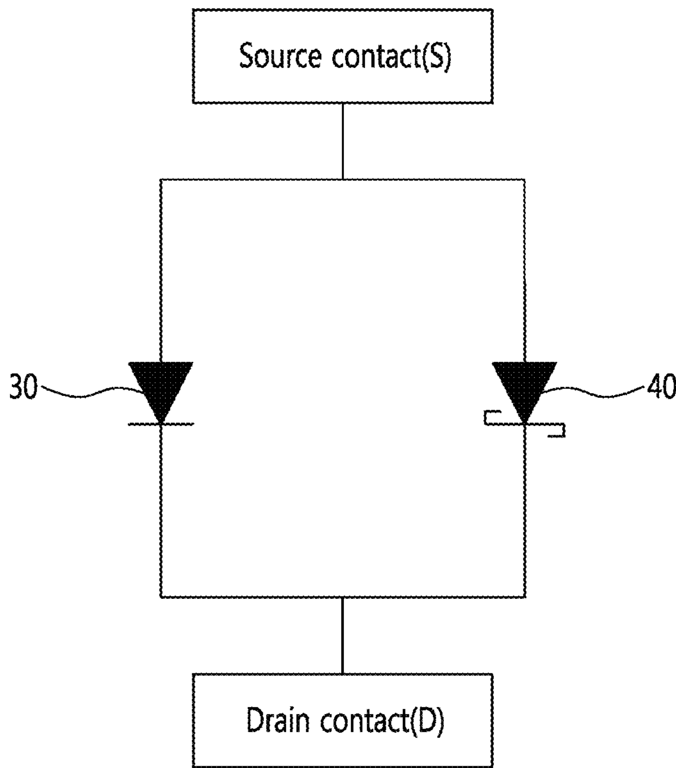
FIG. 2 illustrates a view of an example Schottky barrier diode and a body diode in accordance with one or more embodiments.

FIG. 2 illustrates a view of an example Schottky barrier diode and a body diode in accordance with one or more embodiments.

Referring to FIG. 2, an example semiconductor device 100 in accordance with one or more embodiments may include a body diode 30 and a Schottky barrier diode 40. The semiconductor device 100 may have two recovery routes where a switching device is turned from ON-state to complete OFF-state. First, the semiconductor device 100 may have a recovery route by the body diode 30 formed by the PN junction between a P-type body region 134 and an N-type drift region 133. Thus, when the switch is turned from ON-state to OFF-state, electron carriers may escape through the forward operation of the body diode 30.

Second, the semiconductor device 100 may have a recovery route by the Schottky barrier diode 40 formed in an isolation region 102 in accordance with one or more embodiments.

A reverse recovery time ($T_{rr}$) of the high voltage semiconductor device 100 is short since there is a switching diode where the body diode 30 and the Schottky barrier diode 40 are combined. That allows less switching loss of the high voltage semiconductor device 100.

Figure 3:
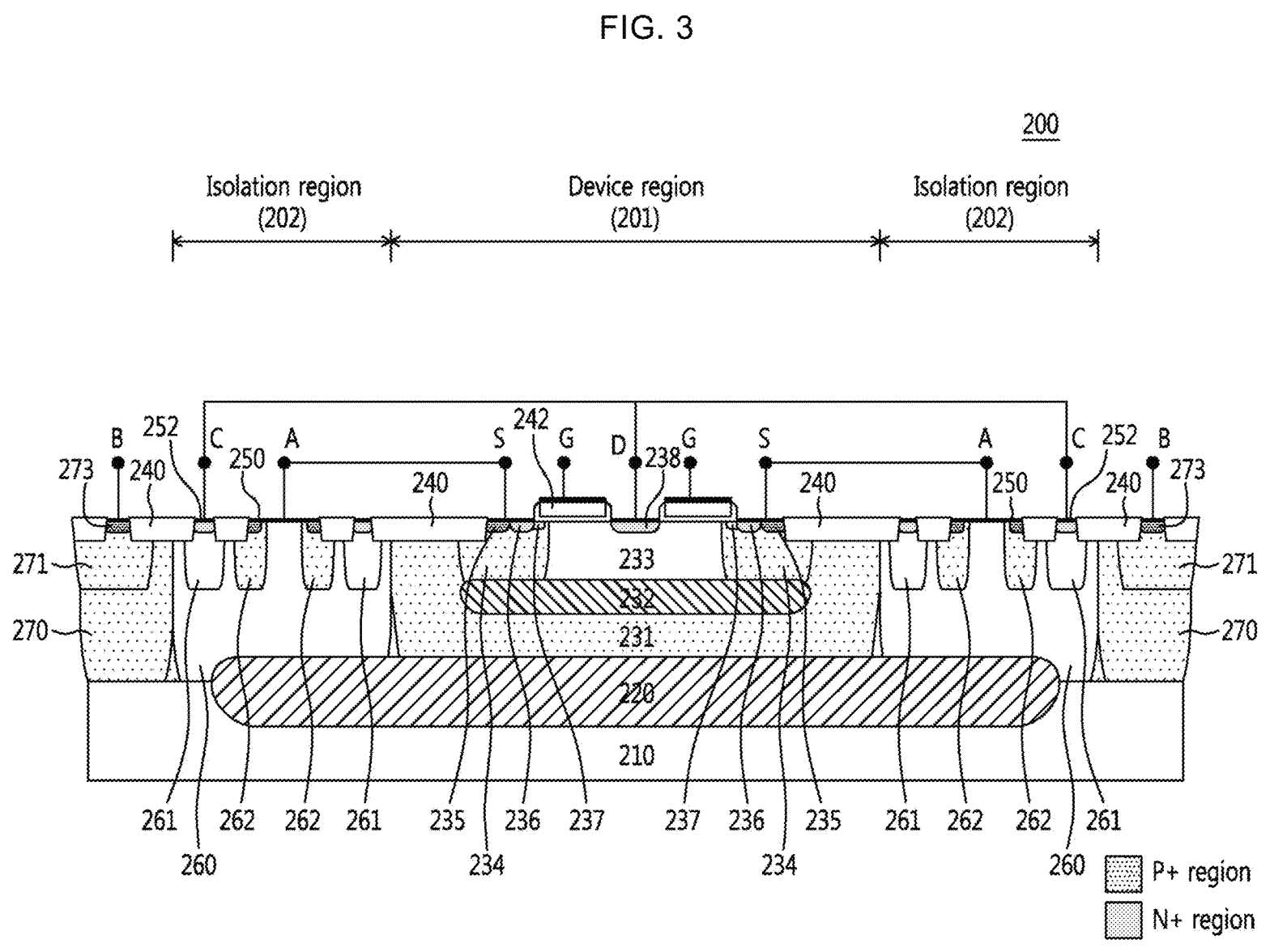

FIG. 3 illustrates a sectional view of another example high voltage semiconductor device having a Schottky barrier diode in accordance with one or more embodiments.

Referring to FIG. 3, a high voltage semiconductor device 200 may include a device region 201 and an isolation region 202. The device region 201 and the isolation region 202 may include a body diode 30 and a Schottky barrier diode 40, respectively. The difference compared to FIG. 1 is that the high voltage semiconductor device 200 of FIG. 3 has a symmetrical structure with respect to the device region 201. In other words, the high voltage semiconductor device 200 has a structure where the isolation region 202 is on both sides of the device region 201.

The high voltage semiconductor device 200 (or device region 201) may further include an N-type buried layer (NBL) 220 formed in a substrate 210; a P-type semiconductor region 231 formed on the N-type buried layer 220; a P-type buried layer (PBL) 232 formed on the P-type semiconductor region 231 and formed in contact with an N-type drift region 233 and a P-type body region 234. The N-type buried layer 220 may be formed to extend in contact with the N-type semiconductor region 260 of the isolation region 202. Herein, the substrate 210 may be a P-type silicon substrate.

The N-type buried layer 220 may be desired for forming a fully isolated high voltage device (e.g., nLDMOS device) in the device region 201. The N-type buried layer 220 may aim to reduce the noise arising from the switching of the high-voltage device.

In the P-type semiconductor region 231, there may be the P-type buried layer 232, the N-type drift region 233, the P-type body regions 234, P-type pick-up regions 235, N-type source regions 236, N-type LDD regions 237, and an N-type drain region 238.

The P-type buried layer 232 suppresses the operation of a parasitic NPN BJT under a high voltage device (e.g., nLDMOS) to reduce a substrate leakage current of the high voltage device (e.g., nLDMOS).

The high voltage semiconductor device 200 (or device region 201) may further include the N-type LDD region 237, the N-type source region 236, and the P-type pick-up region 235 formed inside the P-type body region 234; the N-type drain region 238 formed inside the N-type drift region 233; a gate electrode 242 formed between the N-type source region 236 and the N-type drain region 238; a source contact S; a drain contact D; and a gate contact G.

The source contact S, drain contact D, and gate contact G may be electrically and physically connected to the N-type source region 236, N-type drain region 238, and gate electrode 242, respectively. The source contact S, drain contact D, and gate contact G may be manufactured using materials, such as tungsten (W) and copper (Cu), in the shape of a contact plug.

The isolation region 202 may include the N-type semiconductor region 260, an anode contact A, a cathode contact C, a first silicide layer 250, and a second silicide layer 252. The Schottky barrier diode may be formed by the N-type semiconductor region 260 and the first silicide layer 250.

The anode contact A and the cathode contact C may be directly connected to the first silicide layer 250 and the second silicide layer 252, respectively. The anode contact A of the isolation region 202 may be connected to the source contact S of the device region 201. The cathode contact C of the isolation region 202 may be connected to the drain contact D of the device region 201.

A plurality of isolation layers 240 may be formed in the isolation region 202. An N-type well region 261 and a P-type well region 262 may be formed, placing the isolation layer 240 therebetween. The isolation layer 240 may be referred to as an isolation region (STI) formed of a trench as thin as a predetermined depth. Of course, instead of the STI, a LOCOS oxide film or a trench region having a different depth may be substituted or added. The isolation layer 240 may be in contact with one or more of the P-type semiconductor region 231, P-type body region 234, N-type drift region 233, P-type pick-up region 235, or N-type LDD region 237, depending on the position where it is formed.

The N-type well region 261 may be formed to surround the P-type well region 262. Each highly-doped N-type region (N+) may be formed inside N-type well region 261. Each N-type well region 261 may be formed in contact with the cathode contact C.

The P-type well region 262 may be formed in the N-type semiconductor region 260 of the isolation region 202. Each highly-doped P-type region (P+) may be formed inside P-type well region 262. Each p-type well region 262 may be formed in contact with the anode contact A.

A P-type guard ring region 270 may be formed to surround the isolation region 202. Alternatively, the P-type guard ring region 270 may be formed to surround the N-type semiconductor region 260. A P-type well region 271 and a highly-doped P-type region (P+) 273 may be further included in the P-type guard ring region 270. The P-type guard ring region 270 may provide the ground voltage to the substrate 210.

The overall size of the above-described semiconductor device 200 may be reduced by forming a Schottky barrier diode in the isolation region 202 for isolation between devices. In addition, in the semiconductor device 200 in accordance with one or more embodiments, a Schottky barrier diode is formed in the isolation region 202, and the Schottky barrier diode is connected to a high voltage device (e.g., nLDMOS device) in the device region 201, which allows providing a relatively fast switching speed.

Figure 4:
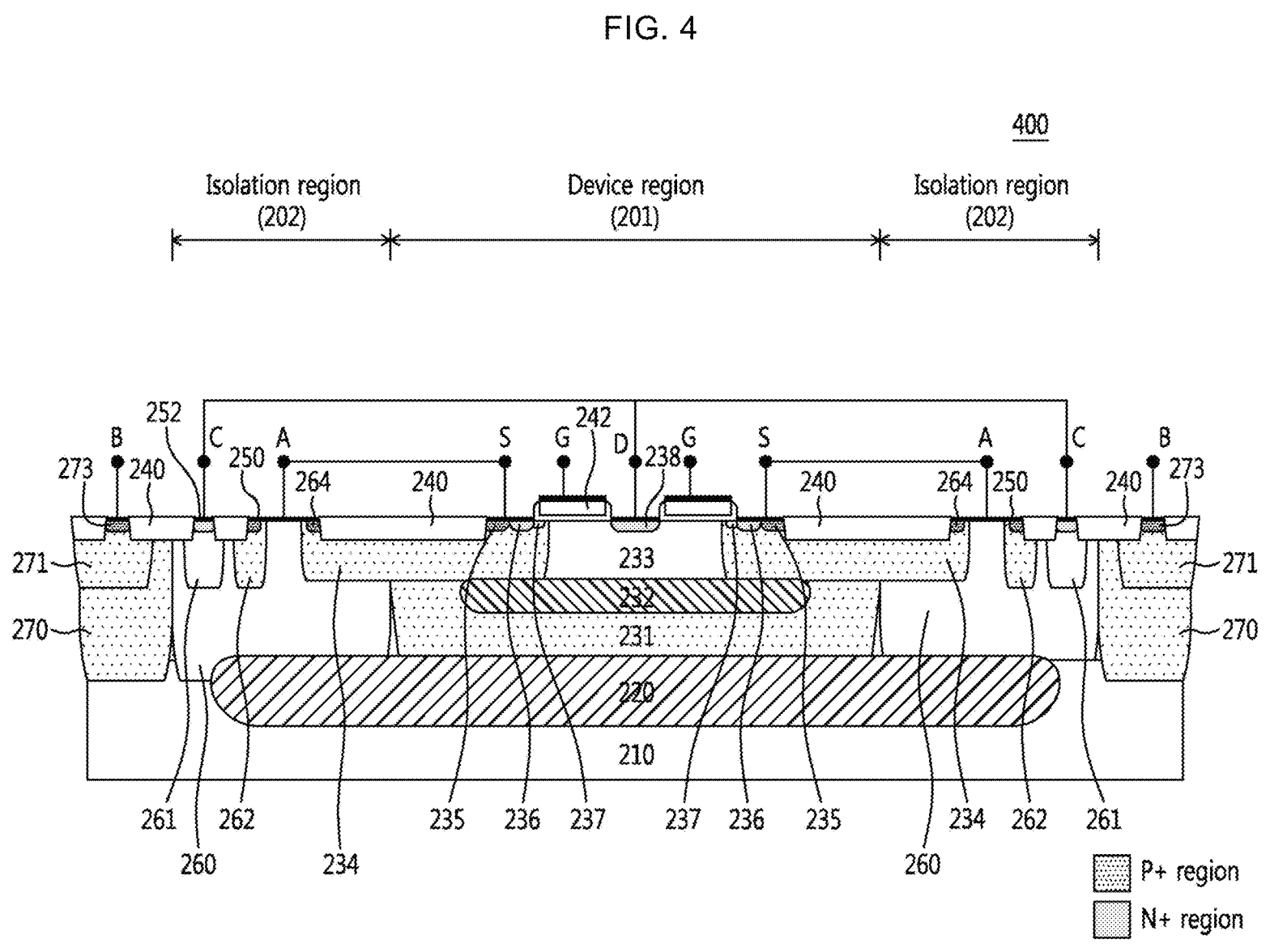

FIG. 4 illustrates a sectional view of an example high-voltage semiconductor device having a Schottky barrier diode in accordance with one or more embodiments.

Referring to FIG. 4, in an example high voltage semiconductor device 400 including a Schottky barrier diode in accordance with one or more embodiments, a P-type body region 234 of a device region 201 may be further extended to overlap an N-type semiconductor region 260 of an isolation region 202, compared to the high voltage semiconductor device 200 of FIG. 3. An anode region is formed on the P-type body region 234. In addition, an isolation layer 240 is formed between the anode region 264 and a P-type pick-up region 235, and the P-type body region 234 may be formed to surround the entire isolation layer 240.

Compared to the semiconductor device 200 of FIG. 3, in the above-described semiconductor device 400, an N-type well region 261 and a P-type well region 262 formed near a source region 236 are removed, and thus the size of a semiconductor chip may be reduced.

Figure 5:
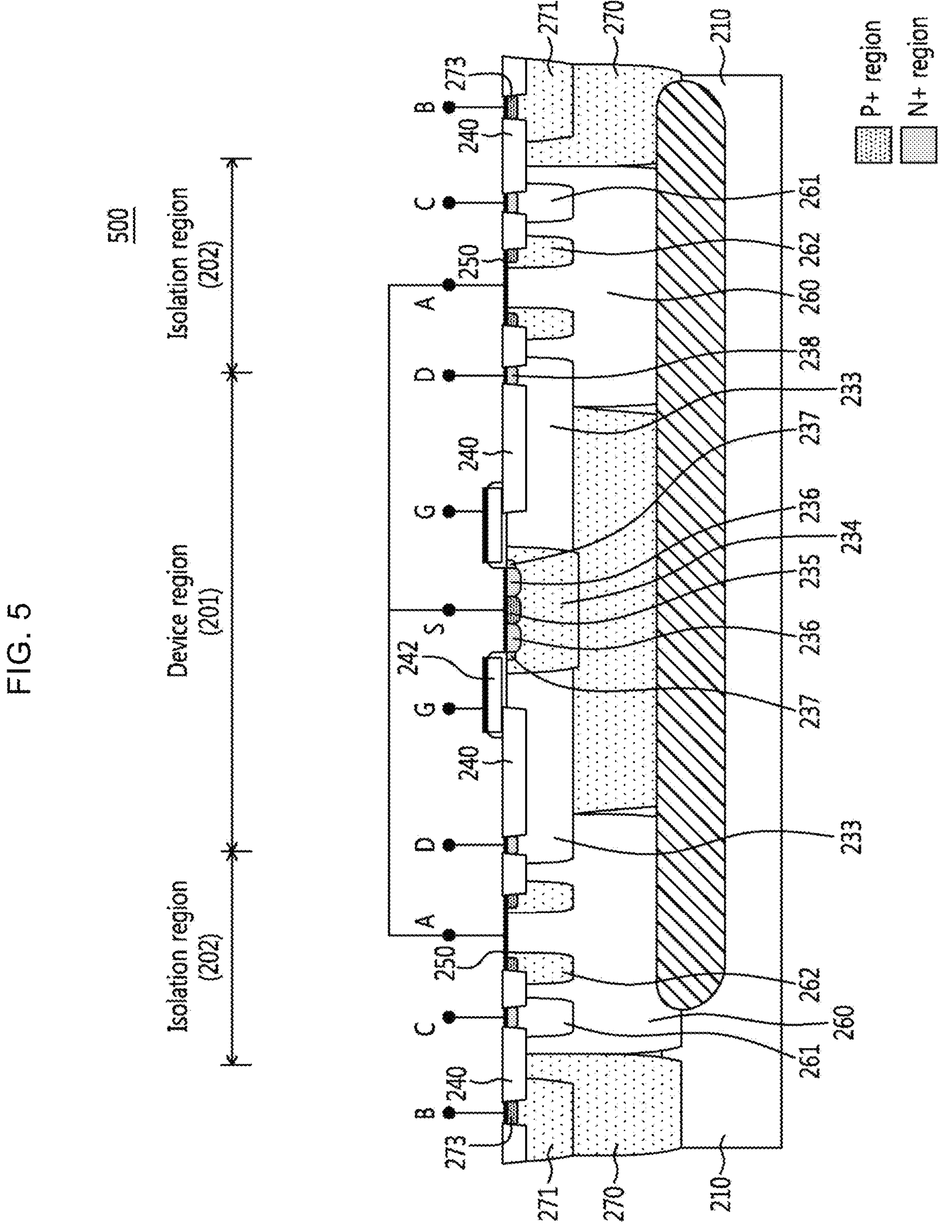
FIG. 5 illustrates a sectional view of an example high-voltage semiconductor device having a Schottky barrier diode in accordance with one or more embodiments.

FIG. 5 illustrates a sectional view of an example high-voltage semiconductor device having a Schottky barrier diode in accordance with one or more embodiments.

Referring to FIG. 5, an example high voltage semiconductor device 500, including a Schottky barrier diode in accordance with one or more embodiments, may have a common source structure. In other words, in the high voltage semiconductor device 500, a P-type body region 234 is formed in the center of a device region 201, and an N-type drift region 233 each is formed on both sides of the P-type body region 234.

The high voltage semiconductor device 500 may be formed such that the N-type drift region 233 of the device region 201 overlaps a portion of an N-type semiconductor region 260 of an isolation region 202.

In the high voltage semiconductor device 500, a drain contact D may be formed on the N-type drift region 233. The drain contact D may overlap the N-type semiconductor region 260 as the N-type drift region 233 overlaps the N-type semiconductor region 260.

Figure 6:
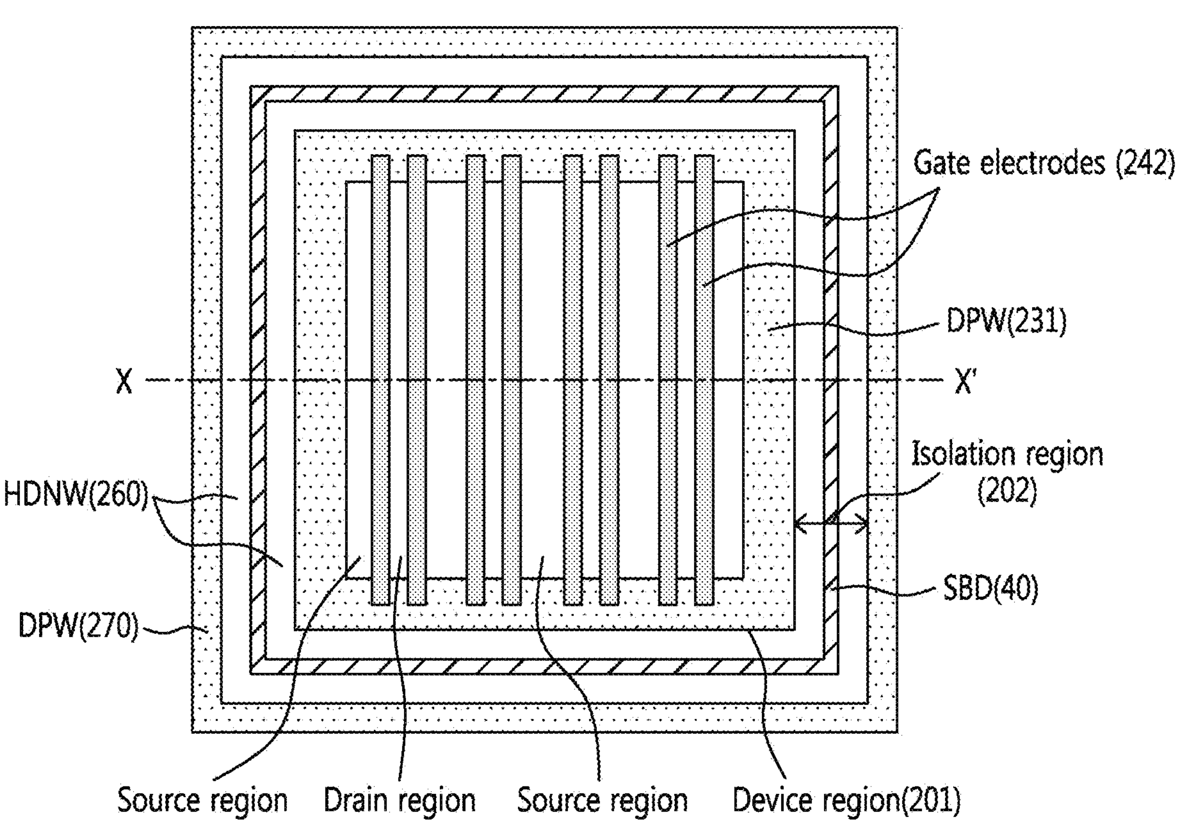
FIG. 6 illustrates a plan view of an example high voltage semiconductor device having a Schottky barrier diode in accordance with one or more embodiments.

FIG. 6 illustrates a plan view of an example high voltage semiconductor device having a Schottky barrier diode in accordance with one or more embodiments.

Referring to FIG. 6, an example high voltage semiconductor device 600, including a Schottky barrier diode in accordance with one or more embodiments, may include a device region 201 and an isolation region 202. In the device region 201, a plurality of high voltage devices (e.g., nLDMOS devices) may be formed in an array form. In the isolation region 202, a Schottky barrier diode 40 may be formed. The isolation region 202 may be formed in the form of a ring (i.e., a square ring) along the outermost portion.

In a plan view, a P-type semiconductor region (DPW) 231 and an N-type semiconductor region (HDNW) 260 may be formed to surround all of a plurality of source regions, drain regions, and gate electrodes 242. A P-type guard ring region (DPW) 270 may be formed to surround the isolation region 202 in the shape of a ring at the outermost portion.

Figure 7:
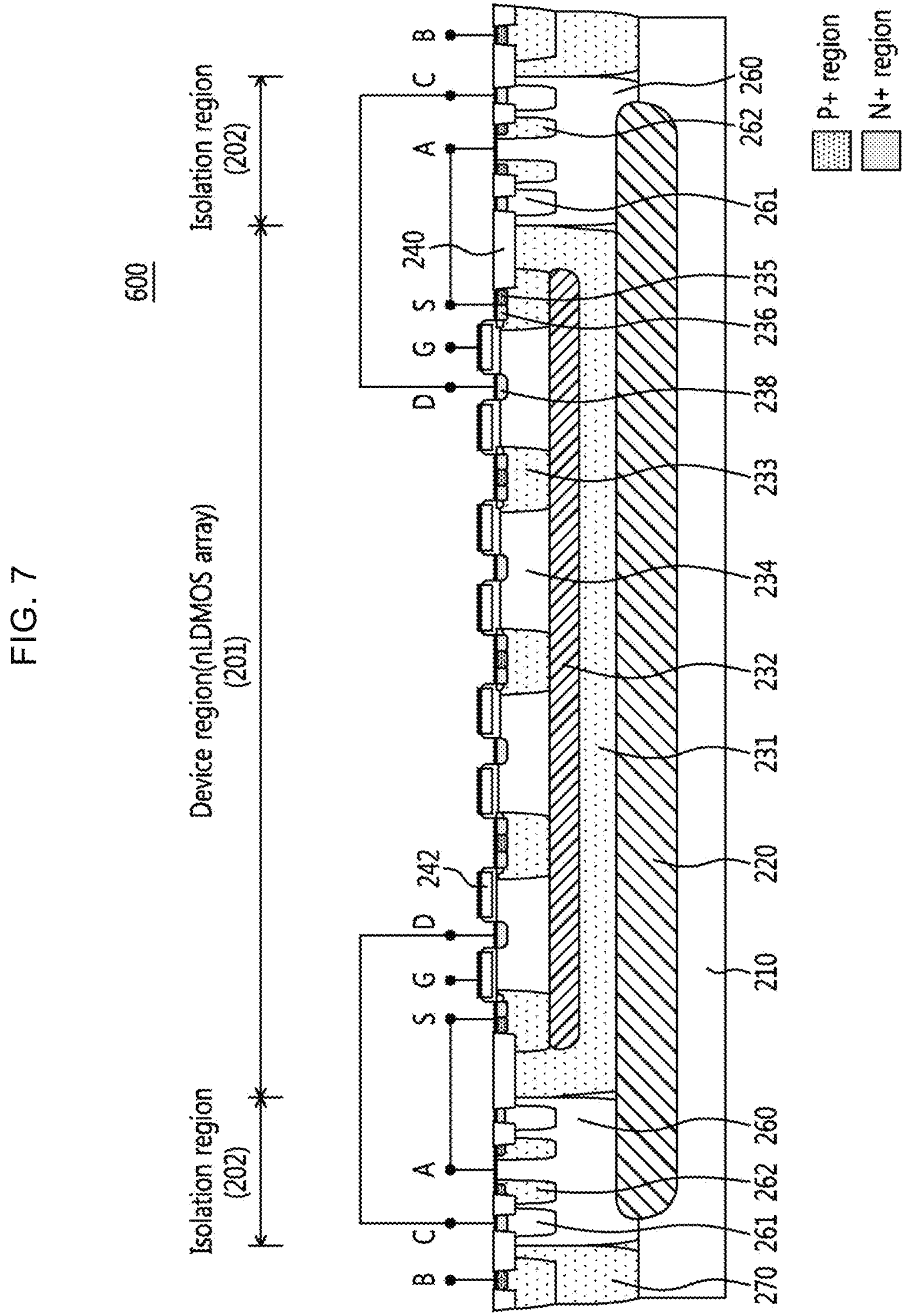
FIG. 7 illustrates a sectional view taken along the line X-X' in FIG. 6.

FIG. 7 illustrates a sectional view taken along the X-X' in FIG. 6.

Referring to FIG. 7, a high voltage semiconductor device 600 may include a device region 201 and an isolation region 202, and a plurality of high voltage devices (e.g., nLDMOS devices) may be formed in an array form in the device region 201. In the isolation region 202, a Schottky barrier diode may be formed.

The device region 201 of the high voltage semiconductor device 600 includes an N-type buried layer 220 formed in a substrate 210, a P-type semiconductor region 231, and a P-type buried layer 232. A plurality of P-type body regions 234, an N-type drift region 233, an N-type source region 236, a P-type pick-up region 235, an N-type drain region 238, and a gate electrode 242 are included inside the P-type semiconductor region 231. In addition, a plurality of source contacts S, drain contacts D, and gate contacts G are included.

The isolation region 202 includes an N-type semiconductor region 260 formed to surround the P-type semiconductor region 231, an anode contact A, a cathode contact C, and a body contact B, so the anode contact A and cathode contact C of the isolation region 202 may be electrically directly connected to the source contact S and drain contact D of the device region 201, respectively.

Figure 8:
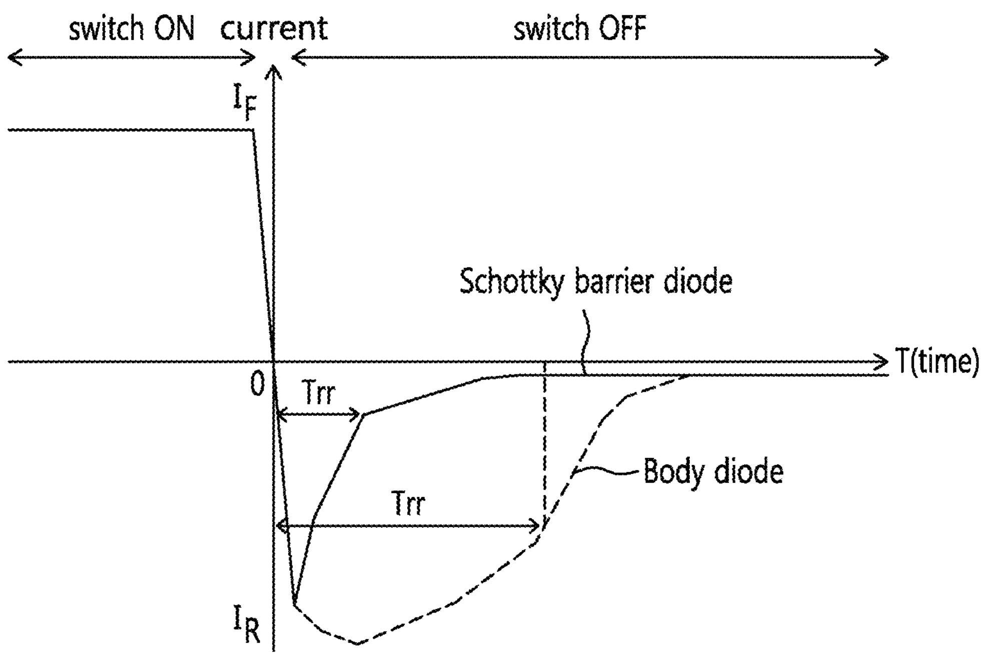
FIG. 8 illustrates a graph showing the variation of current when a switching diode is changed from switch ON-state to switch OFF-state.

FIG. 8 illustrates a graph showing the change in current when a switching diode changes from switch ON-state to switch OFF-state.

Referring to FIG. 8, in a body diode 30 and a Schottky barrier diode 40 that operate as switching diodes, when the switch changes from switch ON-state to switch OFF-state, the current instantaneously flows in the reverse direction, and as time elapses, it may be recovered to a value near zero. As such, in the switching diodes, since the forward current ($I_F$) rapidly switches in the reverse direction during the switching operation, a reverse recovery time ($T_{rr}$) that is the amount of time where the reverse current ($I_R$) flows instantaneously may be desired. The example high voltage semiconductor devices in accordance with one or more embodiments form the Schottky barrier diode 40 as well as the body diode 30 in the isolation region 202, thereby reducing the reverse recovery time ($T_{rr}$).

According to one or more embodiments, the size of a semiconductor chip may be reduced as a Schottky barrier diode is formed in the isolation region of the substrate to electrically isolate adjacent high voltage devices (e.g., nLDMOS).

While this disclosure includes specific examples, it will be apparent after an understanding of the one or more examples of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:

a device region comprising a source contact, a drain contact formed on a substrate, and a gate contact formed between the source contact and the drain contact;

an isolation region surrounding the device region, the isolation region comprising an N-type semiconductor region formed on the substrate, a first silicide layer and a second silicide layer formed in the N-type semiconductor region and separated from each other by an isolation layer, and an anode contact and a cathode contact connected to the first silicide layer and the second silicide layer, respectively; and a Schottky barrier diode formed inside the isolation region by a junction of the first silicide layer and the N-type semiconductor region, wherein the anode contact is connected to the source contact, and the cathode contact is connected to the drain contact.

2. The semiconductor device of claim 1, wherein the device region further comprises:

a source region formed in a P-type body region; and a drain region formed in an N-type drift region.

3. The semiconductor device of claim 1, further comprising a P-type guard ring region surrounding the isolation region.

4. The semiconductor device of claim 1, wherein the isolation region further comprises:

a first P-type well region and a second P-type well region formed in contact with the first silicide layer; and an N-type well region formed in contact with the second silicide layer.

5. The semiconductor device of claim 2, wherein the P-type body region of the device region overlaps the N-type semiconductor region of the isolation region.

6. The semiconductor device of claim 2, wherein the N-type drift region of the device region overlaps the N-type semiconductor region of the isolation region.

7. The semiconductor device of claim 1, wherein the device region further comprises:

an N-type buried layer formed on the substrate;

a P-type semiconductor region formed on the N-type buried layer; and a P-type buried layer formed in the P-type semiconductor region, wherein the N-type buried layer contacts the N-type semiconductor region of the isolation region.

8. The semiconductor device of claim 7, wherein a length of the N-type buried layer is greater than a length of the P-type buried layer.

9. A semiconductor device comprising:

a source region and a drain region formed in a substrate;

a gate electrode formed between the source region and the drain region;

an N-type semiconductor region formed to surround the source region, the drain region, and the gate electrode;

a first silicide layer and a second silicide layer formed on the N-type semiconductor region and spaced apart from each other by an isolation layer therebetween;

a Schottky barrier diode formed by a junction of the first silicide layer and the N-type semiconductor region, wherein the source region is connected to the first silicide layer, and the drain region is connected to the second silicide layer;

a source contact connected to the source region;

a drain contact connected to the drain region;

an anode contact connected to the first silicide layer;

a cathode contact connected to the second silicide layer;

a first metal wiring connecting the anode contact and the source contact; and a second metal wiring connecting the cathode contact and the drain contact.

10. The semiconductor device of claim 9, further comprising:

an N-type buried layer formed on the substrate;

a P-type semiconductor region formed on the N-type buried layer; and a P-type buried layer, an N-type drift region, and a P-type body region formed in the P-type semiconductor region, wherein the N-type buried layer is formed in contact with the N-type semiconductor region, and a length of the N-type buried layer is greater than a length of the P-type buried layer.

11. The semiconductor device of claim 9, further comprising a P-type guard ring region surrounding the N-type semiconductor region.

12. A semiconductor device comprising:

an N-type semiconductor region formed to surround a source region, a drain region, and a gate electrode between the source region and the drain region;

silicide layers formed on the N-type semiconductor region and spaced apart from each other by an isolation layer;

a Schottky barrier diode formed at an interface of one of the silicide layers and the N-type semiconductor region; and an isolation region, comprising the N-type semiconductor region, the silicide layers, an anode contact connected to the one of the silicide layers, and a cathode contact connected to the other of the silicide layers, wherein the source region is connected to the one of the silicide layers, and the drain region is connected to another of the silicide layers.

13. The semiconductor device of claim 12, further comprising a device region, wherein the device region comprises the source region and the drain region formed in an N-type drift region.

14. The semiconductor device of claim 13, wherein the isolation region surrounds the device region.

15. The semiconductor device of claim 13, wherein the source region is formed in a P-type body region, and the drain region is formed in an N-type drift region.

* * * * *